United States Patent

[11] 3,631,307

| | | |
|---|---|---|
| [72] | Inventor | **Walter E. Naugler, Jr.** **Redondo Beach, Calif.** |
| [21] | Appl. No. | **11,243** |
| [22] | Filed | **Feb. 13, 1970** |
| [45] | Patented | **Dec. 28, 1971** |
| [73] | Assignee | **International Telephone and Telegraph Corporation** **Nutley, N.J.** |

[54] SEMICONDUCTOR STRUCTURES HAVING IMPROVED HIGH-FREQUENCY RESPONSE AND POWER DISSIPATION CAPABILITIES
6 Claims, 14 Drawing Figs.

[52] U.S. Cl. ........ 317/235 R, 317/234 R, 317/235 Z, 317/235 AJ, 317/235 AK
[51] Int. Cl. ........ H01l 11/06
[50] Field of Search ........ 317/235 (40.13), 235 (47.1), 235 (47)

[56] References Cited

UNITED STATES PATENTS

| | | | |
|---|---|---|---|
| 3,041,213 | 6/1962 | Anderson et al. | 148/1.5 |
| 3,525,910 | 8/1970 | Philips | 317/234 |
| 3,414,441 | 12/1968 | Gershenzon et al. | 148/33 |
| 3,362,856 | 1/1968 | White | 148/33.5 |

*Primary Examiner*—John W. Huckert
*Assistant Examiner*—B. Estrin
*Attorneys*—C. Cornel Remsen, Jr., Walter J. Baum, Paul W. Hemminger, Percy P. Lantzy, Philip M. Bolton and Charles L. Johnson, Jr.

ABSTRACT: A semiconductor device which utilizes a non-planar structure to provide for an increased power capability and an improved high-frequency performance. A multiplicity of emitter regions are isolated on plateaus wherein each plateau is surrounded by a moat. A base region forms a PN junction with each emitter region, which junction extends to the edge of the moat. The base region has a portion which extends toward the base of the moat within the periphery of the plateau. An insulated base electrode is placed within the moat so as to make contact with the base region beneath the surface of the device, while contact is made to the emitter region by a metal layer extending over a portion of the device surface. This configuration provides for an increased emitter periphery for a given base area and thus improved high-frequency performance and power capability.

INVENTOR
WALTER E. NAUGLER, JR.
BY [signature]
ATTORNEY

INVENTOR
WALTER E. NAUGLER, JR.
BY Stephen A. Young
ATTORNEY

SEMICONDUCTOR STRUCTURES HAVING IMPROVED HIGH-FREQUENCY RESPONSE AND POWER DISSIPATION CAPABILITIES

BACKGROUND OF THE INVENTION

This invention relates to a semiconductor device having a configuration which results in an improved power dissipation capability and high frequency response.

The electrical performance of a transistor is very often affected by the geometry and dimensions of its emitter and base region and also of metal contacts to those regions. These geometric and dimensional effects are particularly significant in transistors which must have frequency responses in the GHz. range or higher, while still being able to operate at a reasonably high power level. If the area of the emitter region is too large, the emitter to base and collector to base capacitances will be large enough to reduce the gain of these devices at high frequencies and current levels. At very low current levels, current gain falls off with decreasing current because recombination of current carriers has a greater effect. Ideally, emitter areas should be as small as possible but still large enough to receive a metal contact thereto. Since the majority of the emitter base current concentrates at the periphery of the junction therebetween, it has found that improved performance can be obtained if the perimeter of the emitter base junction is as great as possible with respect to the base area. In the standard interdigitated emitter base structure which is utilized in prior art high power frequency devices, a multiplicity of emitter regions extend in comblike fashion between the base metallization. The interdigitated structure is utilized to obtain a maximum ratio of periphery of emitter base junction per base area. However, the limitation placed upon this ratio results from the need to have a base area at the surface of the device which will be large enough to receive a base metallization contact thereto.

SUMMARY OF THE INVENTION

It is the object of this invention to provide for a semiconductor device having improved high-frequency response and power capabilities.

It is another object of the invention to provide for a transistor having an increased ratio of the emitter base junction periphery to the base area.

According to a broad aspect of this invention, there is provided a semiconductor device comprising a body of one conductivity type, said body having at least one moat extending from a major surface thereof, a first dielectric layer attached to said body at the base of said moat, a first region of opposite conductivity type formed within said body adjacent said moat and extending from said first dielectric layer toward said major surface, a first metal layer disposed over said first dielectric layer in said moat and coupled to said first region, a second region of said one conductivity type disposed over said first region and forming a PN-junction therewith, and second metal layer coupled to said second region.

According to another aspect of this invention, there is provided a method of making a semiconductor device comprising the steps forming a first region of one conductivity type contiguous with a second region of opposite conductivity type, forming at least one moat extending from the surface of said first region and into said second region, forming a first dielectric layer at the base of said moat, disposing a first metal layer over said first dielectric layer contiguous with the side of said moat, said first metal layer containing an impurity material of said one conductivity type, disposing a second dielectric layer over said first metal layer contiguous with the first of said moat, said second dielectric layer containing an impurity material of said one conductivity type, extending said first region into said second region by driving said impurity material of said one conductivity type from said first region and said first metal layer into said second region, forming a third region of said opposite conductivity type within the surface of said first region, and forming a metal contact contiguous with said third region.

A feature of this invention provides for a plurality of emitter regions isolated on plateaus wherein each plateau is surrounded by a moat and wherein a metal contact is made to a segment of these emitter regions by a metal layer which is contiguous therewith.

BRIEF DESCRIPTION OF THE DRAWINGS

FIGS. **1*a* to 1*k* show the steps involved in the manufacture of an embodiment of this invention.

DESCRIPTION OF THE PREFERRED EMBODIMENTS

Figure 1A:
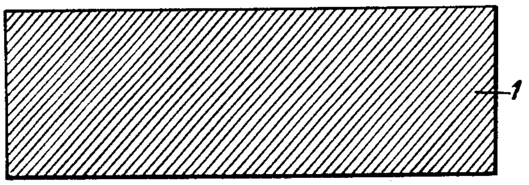
Figure 1E:
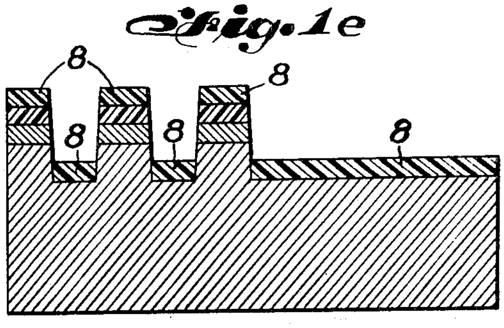
Figure 1B:
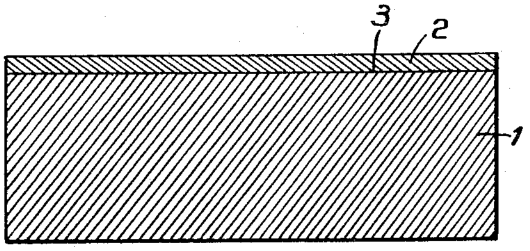
Figure 1F:
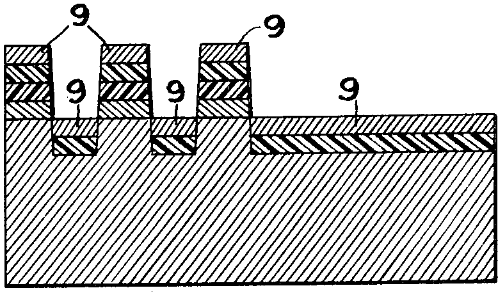
Figure 1C:
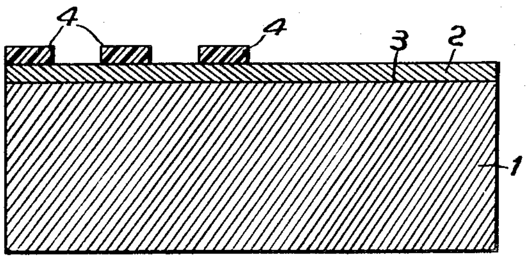

One way in which to increase the ratio of the periphery of the emitter base junction to the area of the base region would be to remove the need to have a base metallization layer attached to the underlying base region at the body surface. One embodiment of such a technique will be explained herewith.

By way of example only, the fabrication of the device can begin with a typical wafer of N-conductivity-type material having a typical resistivity of approximately 2 ohm-cm.; said wafer may be typically 2 inches in diameter, wherein a great number of semiconductor die can be fabricated within this single wafer, and a portion of such a die 1 being shown in FIG. **1*a***.

The wafer is placed in a diffusion chamber wherein a predeposition layer of opposite conductivity type is formed over the wafer surface by diffusing a P-type impurity element, such as boron, into the surface of said wafer at a temperature of about 950° C. for a time such that said predeposition layer achieves a thickness of 1,000 to 2,000 A. then, the region formed by the boron impurity is driven further into the body at a temperature of 1,150° C. until layer 2 having a thickness of approximately one-half micron is formed over the surface of each die, thus forming a PN-junction 3 between layer 2 and die 1, as shown in FIG. **1*b*. While driving boron into the wafer at 1,150° C., a silicon dioxide layer is thermally grown over the wafer surface. This thermally grown oxide layer is removed by applying to said oxide layer a suitable silicon dioxide etchant, such as buffered HF, until the surface of the region 2** is exposed.

Now a hardened photoresist pattern 4 is formed over the surface of each die as shown in FIG. **1*c* using standard photolithographic and etching techniques. A silicon etch, such as CP4 (nitric acid plus acetic acid plus hydrofluoric acid) is applied to those portions of the surface of the die which are not covered by the developed resist 4 so as to form moats 5 and channels 6 as shown in FIG. 1*d* on each die. The depths of the channels and moats should be approximately 2 microns from the surface of each die. Each moat 5 can completely surround a mesa or plateau 7** which is formed under each portion of developed or hardened photoresist. Each moat will extend between an adjoining mesa for approximately 0.8 mil while the surface area of each mesa can be of the order of 0.4 of 1 mil.

In the next step, a silicon dioxide layer 8 is deposited over the surface of each die as shown in FIG. **1*e*. Oxide layer 8 in this example should be deposited to approximately 0.5 micron at the base of each moat 5 and channel 6, and overly each photoresist layer 4 on every mesa 7. The deposition of oxide layer 8** can be carried out using standard pyrolitic techniques, R.F. glow discharge as shown in U.S. application Ser. No. 452,487 by H.F. Sterling et al., Case No. 32/34/35/36-1/2/3/4, or R.F. sputtering in a bell jar as shown in FIG. 13-7 on page 317 of "Integrated Circuits" by Warner and Fordemwalt.

Now a metal containing a P-type dopant is deposited over the previously deposited silicon dioxide layer 8 on each channel, within each moat and over each plateau of each die. This metal layer 9 as shown in FIG. **1*f* may be palladium doped with boron or titanium diboride. The metal layer 9** may be deposited using the above discussed standard R.F. sputtering techniques or standard evaporation techniques. For the example described here, this metal layer should be approximately 5,500 A. in thickness.

Figure 1G:
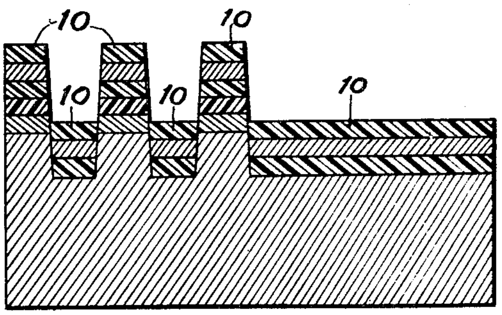
Figure 1D:
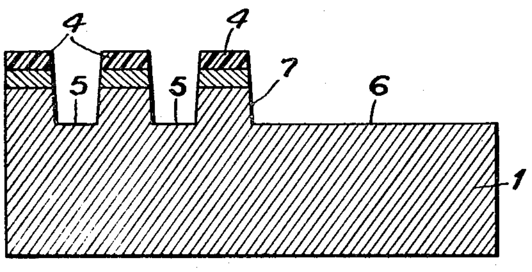

Again, using the above-described deposition techniques for silicon dioxide layer 8, another silicon dioxide layer 10 is similarly deposited over the previously deposited metal layer 9 as shown in FIG. 1*g*. This silicon dioxide layer 10 should have a thickness of approximately 9,000 A. so that those portions of layer 10 which are deposited within moats 5 and channels 6 do not quite overlap the edge of photoresist layer 4, thus allowing resist layer 4 to be easily removed in an ultrasonic bath using a commercially available rinse, such as J-100 (Benzosulphonic acid). Not only is the photoresist layer 4 washed away during the ultrasonic agitation but layer 4 carries with it the portions of the overlying silicon dioxide 8, metal layer 9 and silicon dioxide layer 10 so as to expose the underlying surface 11 of plateaus 7. At this point, only the surfaces 11 of each plateau 7 are exposed on each die.

Figure 1H:
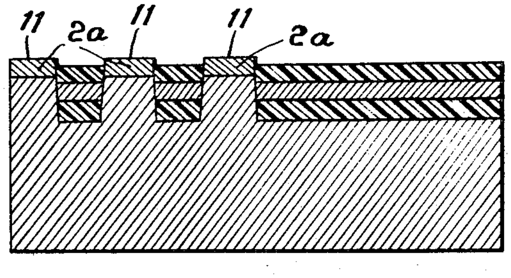
Figure 1I:
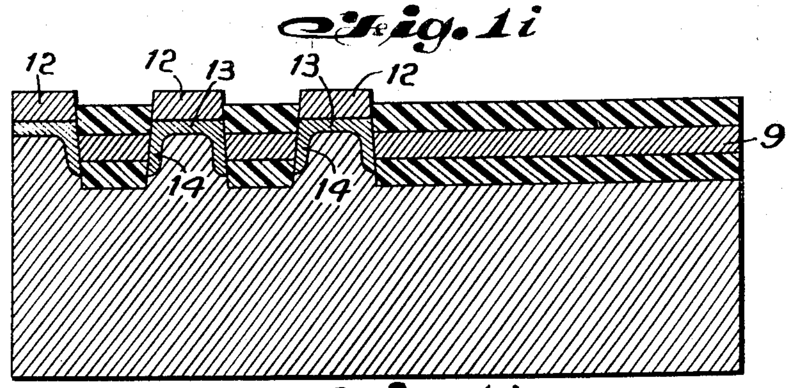

Now, an N-type impurity, such as phosphorus, is diffused into the surface 11 of exposed plateau 7 from an atmosphere containing a phosphorus impurity at a temperature of approximately 1,000° C., until a region 12 of N-conductivity type is formed within the surface of each plateau 7 to a depth of approximately 7,000 A. The previous underlying P-type region 2*a* as shown in FIG. 1*h*, which had a depth of 0.5 micron, now has a main portion 13 which extends to a depth of 10,000 A. from the surface of the plateau during the phosphorus diffusion step. This main portion 13 is shown in FIG. 1*i*. Also, during the phosphorus diffusion step, P-type dopant which is present in metal layer 9 diffuses into the adjacent sides of plateau 7, thereby forming a peripheral portion 14 which is contiguous with main portion 13. Regions 12 on each plateau form a plurality of emitter regions, each of which is isolated from the other by the surrounding dielectric layer 10 deposited within moats 5. The complete region 15 consisting of portions 13 and peripheral portion 14 forms a PN-junction 16 with the overlying emitter region 12 and serves as the base region for the final high-frequency power transistor. Since main portion 13 of base region 15 in effect extends 10,000 A. from the surface of plateau 7, and emitter region 12 extends to a depth of 7,000 A., the effective base width in this device would be approximately 3,000 A. It should be noted that dielectric layer 10 totally surrounds and passivates junction 16. Each base region is electrically connected to the adjacent base region via underlying metal layer 9 which is contiguous with peripheral portions 13 of each base region. The remaining portion 17 of each die 1 serves as the collector region of each die.

Figure 1J:
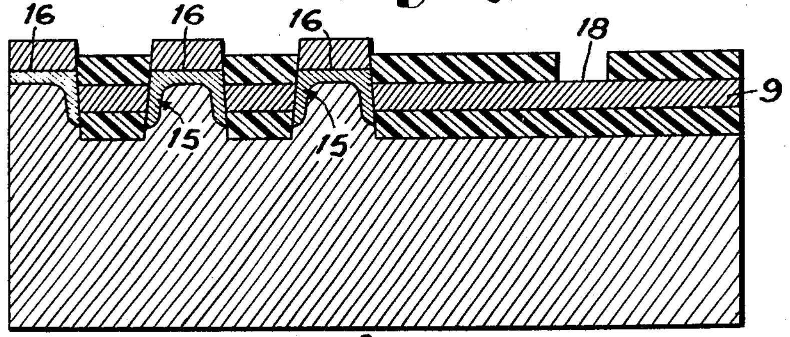
Figure 1K:
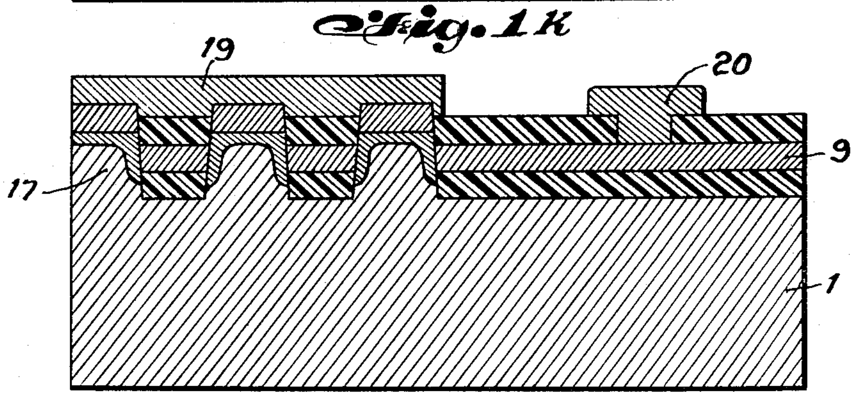

In the next step, a hole 18 as shown in FIG. 1*j* is formed in that portion of dielectric 10 overlying channel 6 using standard photolithographic and etching techniques to expose a portion of underlying metal layer 9 which is electrically coupled to each base region 15. Base and emitter electrodes are formed by depositing a metal layer, such as aluminum, palladium or any other suitable material, over the wafer surface using standard R.F. sputtering or evaporation techniques, to a depth of approximately 2 or 3 microns. Now, using standard photolithographic and etching techniques, portions of the overlying metal layer are removed so as to establish emitter electrode 19 which extends continuously over those areas of each die containing plateaus 7, and base electrode 20 which partially extends over that portion of the surface of each die which overlies channel 6. At this point using standard scribing and fracturing techniques, the wafer is separated into individual die and a final device is packaged using well-known standard assembly techniques for high frequency, high-power transistors.

Figure 2A:
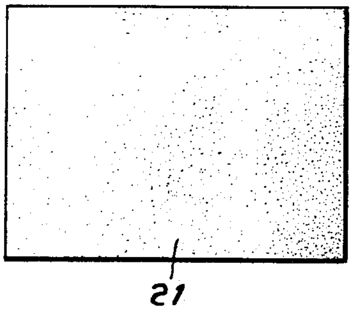
FIGS. 2*a* to 2*c* show a top view of various steps of FIG. 1**.
Figure 2B:
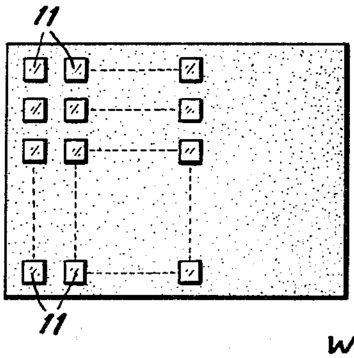
Figure 2C:
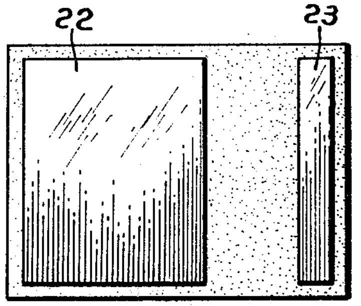

FIGS. 2*a* to 2*c* show a complete top view of the total die during various stages of the formation of the device as previously described. In FIG. 2*a*, the total die surface 21 is shown before any steps in the formation thereof are performed. A typical dimension of this die under these circumstances would be 50 mils by 60 mils. Now, FIG. 2*b* shows how the surface 11 of each plateau 7 appears thereon wherein the system of plateaus are located towards the left side of the die in a 40-mil×40-mil square area, leaving a channel border of approximately 5 mils on the upper, lower and left portions of the surface 21, and channel 6 which is approximately 15 mils in width to the right of said 40×40 square mil area. Finally, in FIG. 2*c*, we see the top portion 22 of the overlying emitter electrode 19 extending over the full 40×40 square mil area, and top portion 23 of base electrode 20 extending to the right thereof along a strip approximately 3×30 mils.

By having the base electrode contact the base region beneath the surface of the die, there results an improvement by 4:1 of the ration of emitter periphery to base area over previous interdigitated-type high-power high-frequency transistors, and thereby resulting in superior performance. Another interesting advantage of this structure over standard interdigitated-type high-power devices results from the relative ease in formation of base and emitter electrodes to the die surface as against the ordinary problems associated with making electrode connections at the side of interdigitated devices.

It is to be understood that the foregoing description of specific examples of this invention is made by way of example only and is not to be considered as a limitation on its scope.

What is claimed is:

1. A transistor comprising:

a semiconductor body of one conductivity type;

a plurality of plateaus extending from said body, each plateau being surrounded by a moat formed in the surface of said body;

first dielectric layers attached to said body at the bottom of each said moat;

a base region of opposite conductivity type semiconductor material formed within each plateau adjacent said moat and extending from said first dielectric layer toward the top surface of each said plateau, said base region forming a first PN-junction with the remainder of said body, the remainder of said body forming a common collector region for each said base region;

first metal layers disposed over each said first dielectric layers in said moat and coupled to each said base region adjacent said moat;

a discrete emitter region of said one conductivity type semiconductor material disposed over each said base region and forming a second PN-junction therewith; and a second metal layer coupled to each said discrete emitter region.

2. A semiconductor device according to claim 1 wherein second dielectric layers are disposed over said first metal layers and are contiguous with said second PN-junction.

3. A semiconductor device according to claim 2 wherein said second metal layer is disposed over each said discrete emitter region and extends over said second dielectric layers.

4. A semiconductor device according to claim 1 wherein said first metal layers are of palladium.

5. A semiconductor device according to claim 2 wherein said first and second dielectric layers are of silicon dioxide.

6. A semiconductor device according to claim 1 wherein all of said plateaus are located along one part of the surface of said body, said second metal layer extends continuously over said part to form an emitter electrode of said device, and one of said first metal layers extending to a section of the remaining part of the surface of said body to form a base electrode.

* * * * *